(12) United States Patent
Hatori

(10) Patent No.: US 9,443,784 B2
(45) Date of Patent: Sep. 13, 2016

(54) SEMICONDUCTOR MODULE INCLUDING PLATE-SHAPED INSULATING MEMBERS HAVING DIFFERENT THICKNESS

(75) Inventor: Kenji Hatori, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/371,854

(22) PCT Filed: Mar. 9, 2012

(86) PCT No.: PCT/JP2012/056078
§ 371 (c)(1),
(2), (4) Date: Jul. 11, 2014

(87) PCT Pub. No.: WO2013/132644
PCT Pub. Date: Sep. 12, 2013

(65) Prior Publication Data
US 2015/0084179 A1    Mar. 26, 2015

(51) Int. Cl.
*H01L 23/10* (2006.01)
*H01L 23/367* (2006.01)
(Continued)

(52) U.S. Cl.
CPC .......... *H01L 23/3672* (2013.01); *H01L 23/13* (2013.01); *H01L 23/36* (2013.01); *H01L 23/373* (2013.01); *H01L 23/3735* (2013.01); *H01L 23/49833* (2013.01); *H01L 25/07* (2013.01); *H01L 25/18* (2013.01); *H01L 24/73* (2013.01); *H01L 25/072* (2013.01); *H01L 2224/32225* (2013.01); *H01L 2224/48137* (2013.01);
(Continued)

(58) Field of Classification Search
CPC ... H01L 23/3672; H01L 23/13; H01L 23/36; H01L 23/373
USPC ........................................................ 257/706
See application file for complete search history.

(56) References Cited

U.S. PATENT DOCUMENTS

| | | | |
|---|---|---|---|
| 5,291,065 | A | 3/1994 | Arai et al. |
| 5,703,399 | A | 12/1997 | Majumdar et al. |

(Continued)

FOREIGN PATENT DOCUMENTS

| | | |
|---|---|---|
| JP | S61-136547 U | 8/1986 |
| JP | H02-026058 A | 1/1990 |

(Continued)

OTHER PUBLICATIONS

Notification Concerning Transmittal of International Preliminary Report on Patentability and Translation of Written Opinion of the International Searching Authority; PCT/JP2012/056078; issued on Sep. 18, 2014.

(Continued)

*Primary Examiner* — Matthew Gordon
(74) *Attorney, Agent, or Firm* — Studebaker & Brackett PC

(57) ABSTRACT

A power semiconductor chip and a low-power portion that has power consumption lower than that of the power semiconductor chip are located on a predetermined surface side of a heat sink having conductivity. A first plate-shaped insulating member extends between the power semiconductor chip and the heat sink. A second plate-shaped insulating member extends between the low-power portion and the heat sink. A portion, which faces the low-power portion, of the second plate-shaped insulating member is thicker than a portion, which faces the power semiconductor chip, of the first plate-shaped insulating member.

6 Claims, 10 Drawing Sheets

(51) Int. Cl.
   *H01L 23/36* (2006.01)
   *H01L 23/13* (2006.01)
   *H01L 23/373* (2006.01)
   *H01L 23/498* (2006.01)
   *H01L 25/18* (2006.01)
   H01L 25/07 (2006.01)
   H01L 23/00 (2006.01)

(52) U.S. Cl.
   CPC ........... *H01L2224/48227* (2013.01); *H01L 2224/49175* (2013.01); *H01L 2224/73265* (2013.01); *H01L 2924/1305* (2013.01); *H01L 2924/13055* (2013.01); *H01L 2924/13091* (2013.01); *H01L 2924/15153* (2013.01); *H01L 2924/15159* (2013.01)

(56) References Cited

U.S. PATENT DOCUMENTS

| | | | |
|---|---|---|---|
| 6,291,880 | B1 | 9/2001 | Ogawa et al. |
| 2008/0111151 | A1 | 5/2008 | Teraki et al. |
| 2010/0181665 | A1* | 7/2010 | Casey ............ H01L 23/04 257/723 |
| 2010/0244092 | A1 | 9/2010 | Ishikawa et al. |
| 2011/0049535 | A1 | 3/2011 | Soeno |

FOREIGN PATENT DOCUMENTS

| | | |
|---|---|---|
| JP | H03-160751 A | 7/1991 |
| JP | H05-166963 A | 7/1993 |
| JP | H05-167006 A | 7/1993 |
| JP | H05-304248 A | 11/1993 |
| JP | H09-139461 A | 5/1997 |
| JP | H11-233712 A | 8/1999 |
| JP | 2004-221381 A | 8/2004 |
| JP | 2005-332918 A | 12/2005 |
| JP | 2006-196853 A | 7/2006 |
| JP | 2008-061374 A | 3/2008 |
| JP | 2009-272482 A | 11/2009 |
| JP | 2010-232576 A | 10/2010 |

OTHER PUBLICATIONS

An Office Action; "Notification of Reason(s) for Refusal," issued by the Japanese Patent Office on Feb. 24, 2015, which corresponds to Japanese Patent Application No. 2014-503390 and is related to U.S. Appl. No. 14/371,854; with English language translation.
International Search Report; PCT/JP2012/056078; Jun. 12, 2012.
An Office Action; "Decision of Refusal," issued by the Japanese Patent Office on May 26, 2015, which corresponds to Japanese Patent Application No. 2014-503390 and is related to U.S. Appl. No. 14/371,854; with English language translation.
An Office Action; "Notice of Reason for Rejection," issued by the Japanese Patent Office on May 20, 2016, which corresponds to Japanese Patent Application No. 2015-134919 and is related to U.S. Appl. No. 14/371,854; with English language translation.

* cited by examiner

F I G . 2
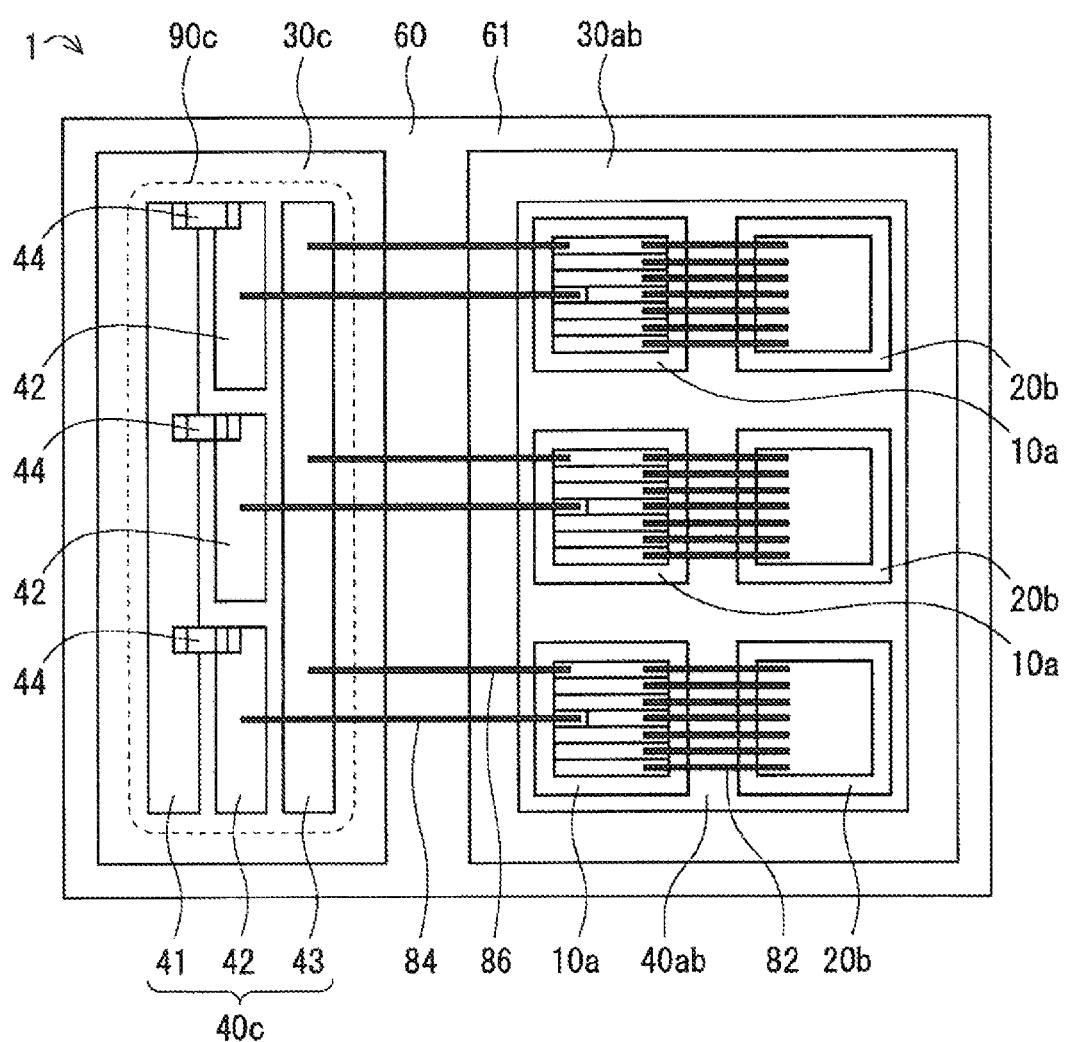

FIG. 5

SEMICONDUCTOR MODULE INCLUDING PLATE-SHAPED INSULATING MEMBERS HAVING DIFFERENT THICKNESS

TECHNICAL FIELD

The present invention relates to a semiconductor module.

BACKGROUND ART

In conventional power modules, power semiconductor chips, insulating substrates, and heat sinks are laminated. Specifically, an insulating substrate is formed of a plate-shaped insulating member having metal layers on both main surfaces, a power semiconductor chip is bonded to one of the metal layers and a heat sink is bonded to the other metal layer. One of the metal layers is formed into a predetermined pattern also having a portion that provides wiring in addition to the portion to which the power semiconductor chip is bonded.

SUMMARY OF INVENTION

Problem to be Solved by the Invention

The heat sink is formed of, for example, metal such as copper. Thus, while the heat sink forms a capacitive electrical coupling to the power semiconductor chip through the plate-shaped insulating member, the heat sink also forms a capacitive electrical coupling to the wiring (provided in one of the metal layers on the plate-shaped insulating member as mentioned above) through the plate-shaped insulating member. Therefore, the power semiconductor chip and the wiring are coupled capacitively through the plate-shaped insulating member and the heat sink.

This capacitive coupling may be a path to transmit noise caused by switching of the power semiconductor chip, for example. When the noise transmitted to the wiring is applied to the power semiconductor chip from the wiring, it is feared that the power semiconductor module may cause a malfunction.

The capacitive coupling between the power semiconductor chip and the wiring can be reduced by making the plate-shaped insulating member thick. In other words, insulating properties between the power semiconductor chip and the wiring can be improved. However, if the plate-shaped insulating member is made to be thick, heat resistance increases, thereby decreasing heat dissipation properties about the power semiconductor chip.

Furthermore, there is a case where the capacitive coupling through the plate-shaped insulating member and the heat sink may also be formed among a plurality of power semiconductor chips, and the same problem as described above may also occur in this case.

In view of such points, it is an object of the present invention to provide a technique capable of securing both insulating properties and heat dissipation properties.

Means to Solve the Problems

A semiconductor module according to an aspect of the present invention includes a heat sink having conductivity, a power semiconductor chip located on a predetermined surface side of the heat sink, a low-power portion that is located on the predetermined surface side of the heat sink and has power consumption lower than that of the power semiconductor chip, a first plate-shaped insulating member extending between the power semiconductor chip and the heat sink, and a second plate-shaped insulating member extending between the low-power portion and the heat sink. A portion, which faces the low-power portion, of the second plate-shaped insulating member is thicker than a portion, which faces the power semiconductor chip, of the first plate-shaped insulating member.

Effects of the Invention

According to the aspect above, the first plate-shaped insulating member can reduce heat resistance below the power semiconductor chip and secure heat dissipation properties. At the same time, the second plate-shaped insulating member can reduce a capacitive coupling between the power semiconductor chip and the low-power portion through the first and the second plate-shaped insulating members and the heat sink and secure insulating properties between the power semiconductor chip and the low-power portion.

These and other objects, features, aspects and advantages of the present invention will become more apparent from the following detailed description of the present invention when taken in conjunction with the accompanying drawings.

BRIEF DESCRIPTION OF DRAWINGS

FIG. 2 is a top view illustrating the semiconductor module according to the first embodiment;

FIG. 5 is a cross sectional view illustrating a semiconductor module according to a modification of the first embodiment;

DESCRIPTION OF EMBODIMENTS

First Embodiment

Figure 1:
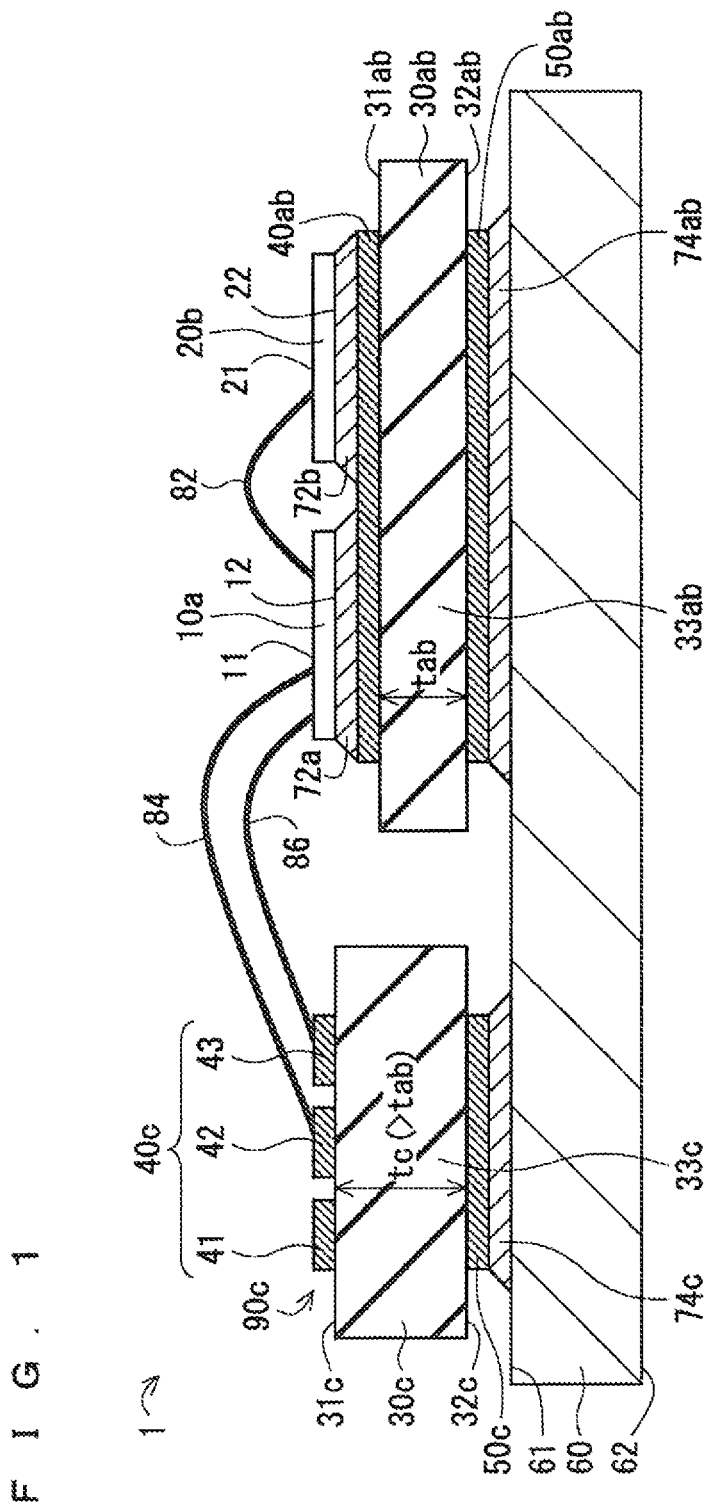
FIG. 1 is a cross sectional view illustrating a semiconductor module according to a first embodiment.

FIG. 1 is a cross sectional view illustrating a power semiconductor module (hereinafter, also referred to as a semiconductor module) 1 according to a first embodiment. In an example of FIG. 1, the semiconductor module 1 includes power semiconductor chips (hereinafter, also referred to as semiconductor chips) 10a and 20b, plate-shaped insulating members 30ab and 30c, metal layers 40ab, 50ab, 40c, and 50c, a heat sink 60, bonding members 72a, 72b, 74ab, and 74c, and connecting members 82, 84, and 86.

The power semiconductor chip 10a has chip main surfaces 11 and 12 in a relationship of the front and back with each other (namely, facing each other through the inside of the chip), and similarly the power semiconductor chip 20b has chip main surfaces 21 and 22. To match the illustration of FIG. 1, the chip main surfaces 11 and 21 are also referred to as chip upper surfaces (or upper surfaces) 11 and 21 and the chip main surfaces 12 and 22 are also referred to as chip lower surfaces (or lower surfaces) 12 and 22. Materials for the semiconductor chips 10a and 20b are, for example, silicon (Si), but one of the semiconductor chips 10a and 20b or both of them may be formed of another material, for example, the so-called wide band gap materials, such as silicon carbide (SiC), gallium nitride (GaN), and the like.

Power semiconductor elements, such as an IGBT (insulated gate bipolar transistor), a MOSFET (metal oxide semiconductor field effect transistor), a diode, and the like are formed in the semiconductor chips 10a and 20b. The semiconductor chips 10a and 20b may be the same kind of elements and may also be different kinds of elements. In a case of the IGBT, for example, an emitter electrode and a gate electrode of the IGBT are provided on the chip upper surface 11 and a collector electrode of the IGBT is provided on the chip lower surface 12.

Predetermined electrodes of the chip upper surfaces 11 and 21 are connected to each other by the connecting member 82. The connecting member 82 is a bonding wire in the example of FIG. 1, but a conductive plate or the like may be used. The chip lower surfaces 12 and 22 are bonded to the metal layer 40ab provided on the plate-shaped insulating member 30ab by the connecting members 72a and 72b such as solder.

The plate-shaped insulating member 30ab has main surfaces 31ab and 32ab in a relationship of the front and back with each other. To match the illustration of FIG. 1, the main surface 31ab is also referred to as an upper surface 31ab and the main surface 32ab is also referred to as a lower surface 32ab. Herein, the case where the main surfaces 31ab and 32ab are flat surfaces and parallel to each other is illustrated, and in this case, the plate-shaped insulating member 30ab has uniform thickness across the entire member. The plate-shaped insulating member 30ab is formed of, for example, an insulating material, such as an epoxy resin filled with filler, a ceramic, or the like.

The metal layer 40ab is bonded to the upper surface 31ab of the plate-shaped insulating member 30ab, and the metal layer 50ab is bonded to the lower surface 32ab of the plate-shaped insulating member 30ab. The metal layers 40ab and 50ab are formed of, for example, copper or the like. The metal layers 40ab and 50ab function as a base for the bonding by the bonding members 72a, 72b, and 74ab such as solder. Moreover, in the example of FIG. 1, the metal layer 40ab also functions as wiring for connecting electrodes of the chip lower surfaces 12 and 22 with each other. If these functions can be achieved, a material other than metal may be used.

In addition, there is a case where a laminate of the plate-shaped insulating member 30ab and the metal layers 40ab and 50ab is referred to as an insulating substrate.

The plate-shaped insulating member 30c has main surfaces 31c and 32c in a relationship of the front and back with each other. To match the illustration of FIG. 1, the main surface 31c is also referred to as an upper surface 31c and the main surface 32c is also referred to as a lower surface 32c. Herein, the case where the main surfaces 31c and 32c are flat surfaces and parallel to each other is illustrated, and in this case, the plate-shaped insulating member 30c has uniform thickness across the entire member. The plate-shaped insulating member 30c is formed of, for example, the material similar to that of the plate-shaped insulating member 30ab.

The metal layer 40c is bonded to the upper surface 31c of the plate-shaped insulating member 30c, and the metal layer 50c is bonded to the lower surface 32c of the plate-shaped insulating member 30c. The metal layers 40c and 50c are formed of, for example, the same material as that of the metal layers 40ab and 50ab.

The metal layer 40c is formed into a predetermined wiring pattern, so that the metal layer 40c may be referred to as a wiring layer 40c, a wiring pattern 40c, or the like. In view of such points, the wiring layer 40c may be formed of a conductive material other than metal. In the example of FIG. 1, a wiring pattern of the metal layer 40c has three wiring portions 41, 42, and 43, and the wiring portions 42 and 43 are connected to the upper surface 11 of the semiconductor chip 10a by the connecting members 84 and 86. The connecting members 84 and 86 are bonding wires in the example of FIG. 1, but a conductive plate or the like may be used.

The metal layer 50c functions as a base for the bonding by the bonding member 74c such as solder, and if this function can be achieved, a material other than metal may be used.

In addition, there is a case where a laminate of the plate-shaped insulating member 30c and the metal layers 40c and 50c is referred to as an insulating substrate.

The heat sink 60 is formed of, for example, a conductive material, such as copper or the like. The heat sink 60 is in a plate shape in the example of FIG. 1 and has main surfaces 61 and 62 in a relationship of the front and back with each other. To match the illustration of FIG. 1, the main surface 61 is also referred to as an upper surface 61 and the main surface 62 is also referred to as a lower surface 62. Herein, the case where the main surfaces 61 and 62 are flat surfaces is illustrated, but the lower surface 62 may have a fin shape, for example.

The plate-shaped insulating members 30ab and 30c are installed on the upper surface 61 of the heat sink 60. Specifically, the metal layer 50ab provided on the lower surface 32ab of the plate-shaped insulating member 30ab is bonded to the upper surface 61 of the heat sink 60 by the bonding member 74ab, and the metal layer 50c provided on the lower surface 32c of the plate-shaped insulating member 30c is bonded to the upper surface 61 of the heat sink 60 by the bonding member 74c. The bonding members 74ab and 74c are solder, for example. This means that the upper surface 61 of the heat sink 60 faces the lower surfaces 32ab and 32c of the plate-shaped insulating members 30ab and 30c.

The configuration on the upper surface 61 of the heat sink 60 is housed inside a sealing member, such as a case, a sealing resin, or the like, which is not shown. However, the lower surface 62 of the heat sink 60 is exposed from the sealing member. In addition, an external terminal, which is not shown, is drawn from the sealing member.

It should be noted that although FIG. 1 illustrates the two semiconductor chips 10a and 20b, the semiconductor module 1 may include only one semiconductor chip or may include three or more semiconductor chips. For example, in a case where only the semiconductor chip 10a is provided, the semiconductor chip 20b, the bonding member 72b, and the connecting member 82 are omitted from the example of FIG. 1. Moreover, in a top view illustrated in FIG. 2, three pairs of combinations of the semiconductor chips 10a and 20b is shown. Additionally, in the example of FIG. 2, the three wiring portions 42 are provided on the plate-shaped insulating member 30c, and balance resistors 44 are connected between each of the wiring portions 42 and the wiring portions 41.

Herein, a configuration portion 90c (including the wiring layer 40c in the example of FIG. 1 and further including the balance resistors 44 in the example of FIG. 2) disposed on the upper surface 31c of the plate-shaped insulating member 30c among circuits installed on the semiconductor module 1 has power consumption (namely, power being handled) lower than that of the semiconductor chips 10a and 20b. Thus, the configuration portion 90c is also referred to as a low-power portion 90c.

The low-power portion 90c is a portion which supplies a predetermined signal (for example, a control signal such as a gate signal or the like) to the semiconductor chip 10a in the examples of FIGS. 1 and 2. This signal supplying portion may include, for example, various circuits (for example, a circuit that generates a control signal for the semiconductor chip 10a from an external input signal). Moreover, in addition to the signal supplying portion or instead of it, the low-power portion 90c may include, for example, a signal acquisition portion that acquires a predetermined signal (for example, a signal regarding a chip temperature) from one of the semiconductor chips 10a and 20b or both of them. Furthermore, the low-power portion 90c may further include, for example, a pad portion (that can be formed by the metal layer 40c) connected to the external terminal or may only include such pad portion.

Moreover, a connection between the external terminal and the semiconductor chips 10a and 20b can be achieved by a direct bonding or an indirect connection through a bonding wire or the like without using the pad portion in the low-power portion 90c.

In this manner, the low-power portion 90c can adopt various kinds of configurations, and its power consumption is lower than that of the semiconductor chips 10a and 20b, thereby generating the smaller amount of heat than that of the semiconductor chips 10a and 20b.

In the configuration of the semiconductor module 1, the semiconductor chips 10a and 20b and the low-power portion 90c are both provided on the upper surface 61 side of the heat sink 60, the plate-shaped insulating member 30ab extends between the semiconductor chips 10a and 20b and the heat sink 60, and the plate-shaped insulating member 30c extends between the low-power portion 90c and the heat sink 60. Furthermore, a thickness tc of a portion 33c, which faces the low-power portion 90c, of the plate-shaped insulating member 30 is greater than a thickness tab of a portion 33ab, which faces the semiconductor chips 10a and 20b, of the plate-shaped insulating member 30ab (tc>tab).

Therefore, the thin plate-shaped insulating member 30ab for the semiconductor chips 10a and 20b can reduce heat resistance below the semiconductor chips 10a and 20b. Thus, heat dissipation properties about the semiconductor chips 10a and 20b can be secured. Furthermore, considering that the low-power portion 90c generates the smaller amount of heat than that of the semiconductor chips 10a and 20b, the thick plate-shaped insulating member 30c is adopted for the low-power portion 90c, which allows for a reduction in a capacitive coupling between the semiconductor chips 10a and 20b and the low-power portion 90c through the plate-shaped insulating members 30ab and 30c and the heat sink 60. Consequently, insulating properties between the semiconductor chips 10a and 20b and the low-power portion 90c can be secured. In this manner, the semiconductor module 1 can secure both of the heat dissipation properties and the insulating properties.

It should be noted that although the plate-shaped insulating members 30ab and 30c are at a distance from each other, these plate-shaped insulating members 30ab and 30c may be in contact with each other. This deformation is also applicable to various semiconductor modules as described below.

Second Embodiment

Figure 3:
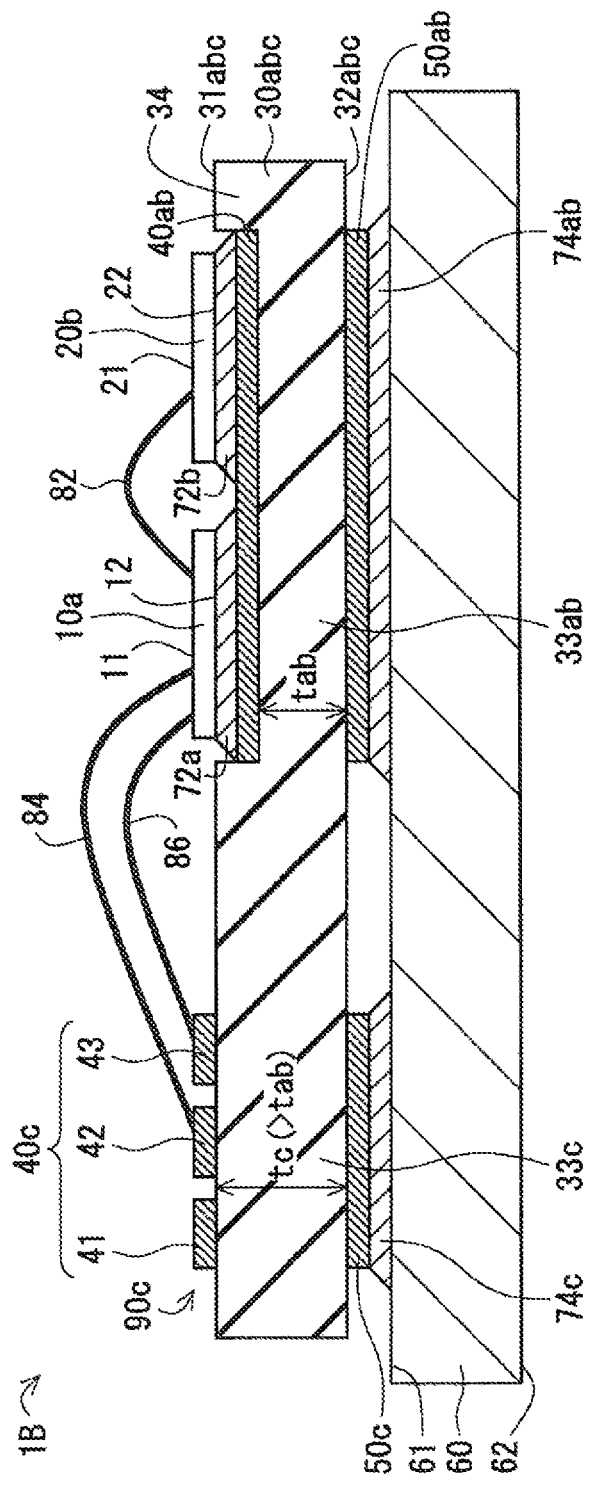
FIG. 3 is a cross sectional view illustrating a semiconductor module according to a second embodiment.

FIG. 3 illustrates a cross sectional view of a semiconductor module 1B according to a second embodiment. The semiconductor module 1B has a configuration in which the plate-shaped insulating members 30ab and 30c in the semiconductor module 1 (see FIG. 1) illustrated in the first embodiment are changed to a plate-shaped insulating member 30abc. Other configuration of the semiconductor module 1B is basically similar to that of the semiconductor module 1.

The plate-shaped insulating member 30abc schematically corresponds to a member in which the plate-shaped insulating members 30ab and 30c (see FIG. 1) illustrated in the first embodiment are integrated. In other words, the plate-shaped insulating member 30abc extends between the semiconductor chips 10a and 20b and the heat sink 60 and also extends between the low-power portion 90c and the heat sink 60. The plate-shaped insulating member 30abc has main surfaces 31abc and 32abc in a relationship of the front and back with each other. To match the illustration of FIG. 3, the main surface 31abc is also referred to as an upper surface 31abc and the main surface 32abc is also referred to as a lower surface 32abc.

In the common plate-shaped insulating member 30abc, a thickness tc of a portion 33c, which faces the low-power portion 90c, is greater than a thickness tab of a portion 33ab, which faces the semiconductor chips 10a and 20b (tc>tab). In the example of FIG. 3, in the upper surface 31abc of the plate-shaped insulating member 30abc, a region facing the semiconductor chips 10a and 20b is located toward the lower surface 32abc compared to a region facing the low-power portion 90c. In the example of FIG. 3, any of the regions are flat. On the other hand, the lower surface 32abc of the plate-shaped insulating member 30abc is flat in the example of FIG. 3. By such shapes of the upper surface 31abc and the lower surface 32abc, different thicknesses are formed in the common plate-shaped insulating member 30abc.

For example, a plate-shaped insulating member before curing is rolled in two steps, so that the thickness difference can be formed. Specifically, first of all, the plate-shaped insulating member before curing is rolled to match the thickness of the thick portion 33c, and subsequently a predetermined portion is rolled again to match the thickness of the thin portion 33ab.

The semiconductor module 1B can secure both of the heat dissipation properties and the insulating properties similarly to the semiconductor module 1. Specifically, the thin portion 33ab, which faces the semiconductor chips 10a and 20b, of the plate-shaped insulating member 30abc can reduce heat resistance below the semiconductor chips 10a and 20b. Thus, the heat dissipation properties about the semiconductor chips 10a and 20b can be secured. Furthermore, the thick portion 33c, which faces the low-power portion 90c, of the plate-shaped insulating member 30abc can reduce a capacitive coupling between the semiconductor chips 10a and 20b and the low-power portion 90c through the plate-shaped insulating member 30abc and the heat sink 60. Consequently, the insulating properties between the semiconductor chips 10a and 20b and the low-power portion 90c can be secured.

Moreover, the metal layers 50ab and 50c on the lower surface 32abc side of the plate-shaped insulating member 30abc can be changed to one metal layer. In this case, the bonding members 74ab and 74c can be changed to one bonding member. This deformation is also applicable to various semiconductor modules as described below.

Modifications of First and Second Embodiments

The semiconductor module 1B illustrated in FIG. 3 has a protruding portion 34 at the end portion of the upper surface 31abc of the plate-shaped insulating member 30abc. This protruding portion 34 is provided so as to surround the thin portion 33ab facing the semiconductor chips 10a and 20b. The thickness of the protruding portion 34 is set to tc in the example of FIG. 3, but this example is not restrictive.

Figure 4:
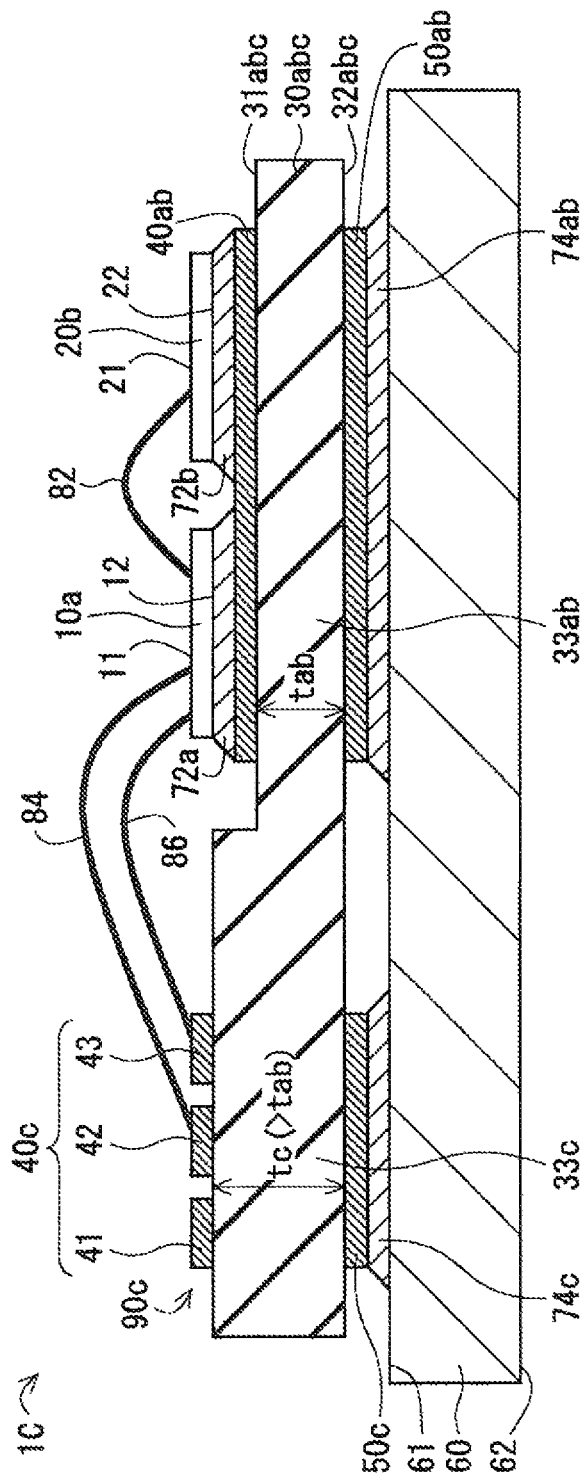
FIG. 4 is a cross sectional view illustrating a semiconductor module according to a modification of the second embodiment.

As opposed to this, the protruding portion 34 can be omitted similarly to a semiconductor module 1C according to a modification of the second embodiment illustrated in FIG. 4.

The protruding portion 34 can increase a creepage distance (distance through an end face of the plate-shaped insulating member 30abc) between the upper surface 31abc side of the thin portion 33ab and the lower surface 32abc side thereof. Thus, insulating properties of a creepage surface between a potential on the upper surface 31abc side and a potential on the lower surface 32abc side can be secured.

On the other hand, in a case without the protruding portion 34, the shape of the plate-shaped insulating member 30abc is simplified, thereby facilitating a manufacturing of the plate-shaped insulating member 30abc.

Figure 5:
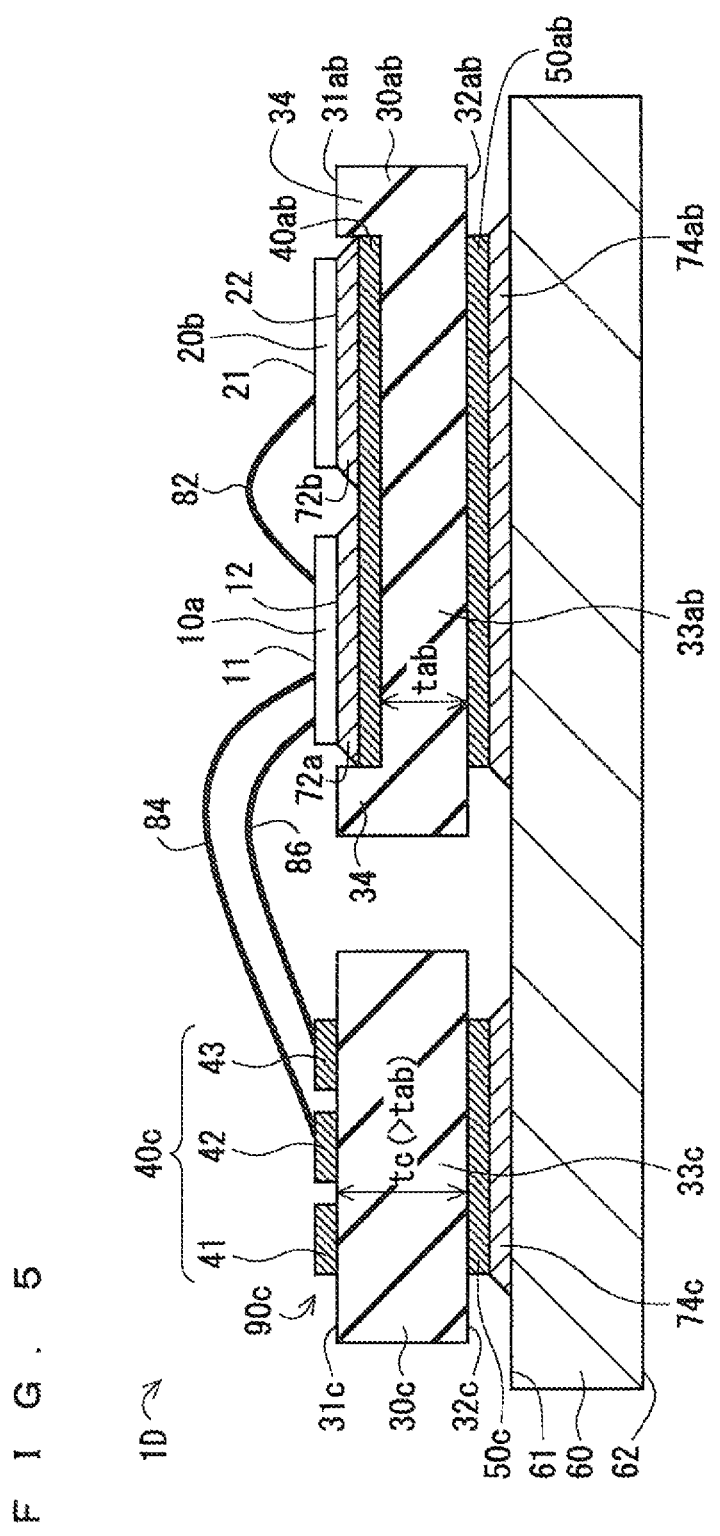

The protruding portion 34 is also applicable to the semiconductor module 1 illustrated in the first embodiment. FIG. 5 illustrates a semiconductor module 1D with the addition of this deformation. In the example of FIG. 5, the protruding portion 34 is provided at the end portion of the upper surface 31ab of the plate-shaped insulating member 30ab for the semiconductor chips 10a and 20b.

Third Embodiment

Semiconductor chips formed of the so-called wide band gap materials, such as silicon carbide (SiC), gallium nitride (GaN), and the like can achieve a high temperature operation compared to semiconductor chips formed of silicon (Si). In other words, the wide band gap semiconductors provide chips having high heat resistance. In a third embodiment, a semiconductor module in which semiconductor chips having different heat resistances are mixed will be described. Hereinafter, a semiconductor chip having higher heat resistance is also referred to as a high-heat-resistant chip, and a semiconductor chip having lower heat resistance is also referred to as a low-heat-resistant chip for the sake of convenience.

Figure 6:
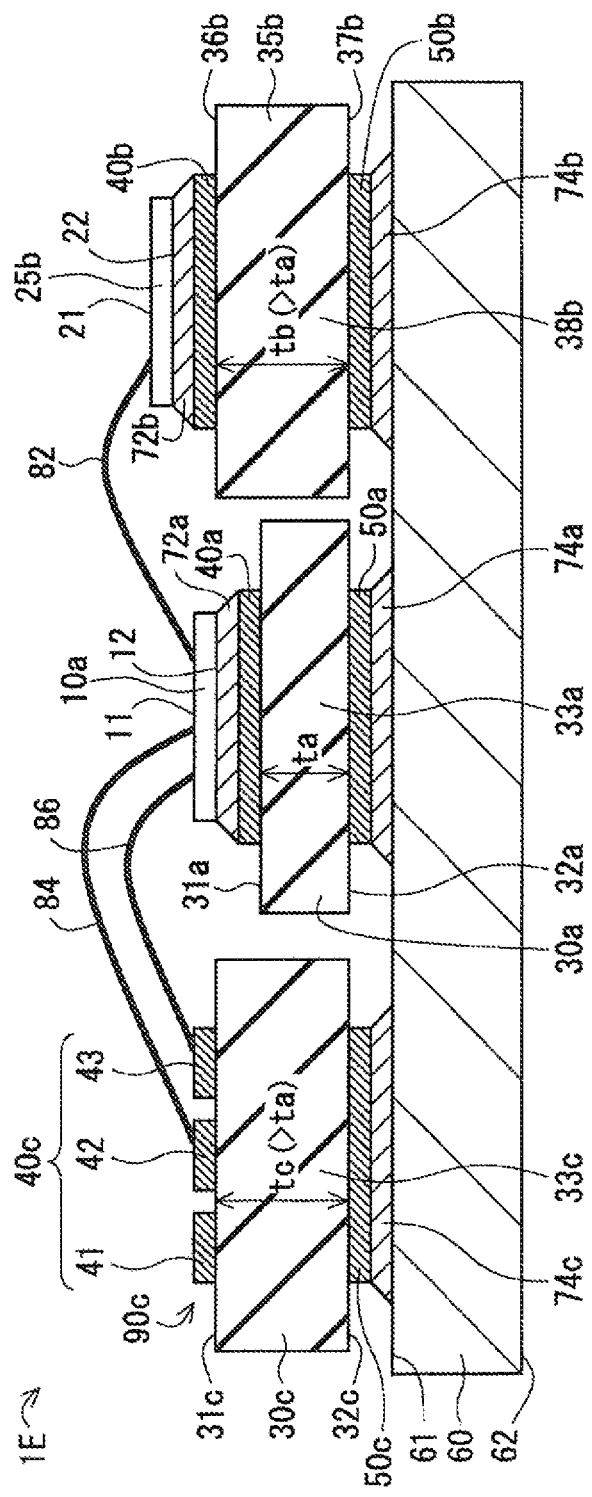
FIG. 6 is a cross sectional view illustrating a semiconductor module according to a third embodiment.

FIG. 6 illustrates a cross sectional view of a semiconductor module 1E according to the third embodiment. The semiconductor module 1E has a configuration in which the semiconductor chip 20b in the semiconductor module 1 (see FIG. 1) illustrated in the first embodiment is changed to a high-heat-resistant chip 25b having heat resistance higher than that of the semiconductor chip 10a. In this example, hereinafter, the semiconductor chip 10a is also referred to as a low-heat-resistant chip 10a. Furthermore, in the semiconductor module 1E, the plate-shaped insulating member 30ab or the like illustrated in the first embodiment is divided for the low-heat-resistant chip 10a and the high-heat-resistant chip 25b. Other configuration of the semiconductor module 1E is basically similar to that of the semiconductor module 1.

Specifically, the plate-shaped insulating member 30a for the low-heat-resistant chip 10a has main surfaces 31a and 32a in a relationship of the front and back with each other. To match the illustration of FIG. 6, the main surface 31a is also referred to as an upper surface 31a and the main surface 32a is also referred to as a lower surface 32a. Herein, the case where the main surfaces 31a and 32a are flat surfaces and parallel to each other is illustrated, and in this case, the plate-shaped insulating member 30a has uniform thickness across the entire member.

A metal layer 40a is bonded to the upper surface 31a of the plate-shaped insulating member 30a, and the metal layer 40a is bonded to the lower surface 12 of the low-heat-resistant chip 10a by the bonding member 72a. Moreover, a metal layer 50a is bonded to the lower surface 32a of the plate-shaped insulating member 30a, and the metal layer 50a is bonded to the upper surface 61 of the heat sink 60 by the bonding member 74a.

Furthermore, the plate-shaped insulating member 35b for the high-heat-resistant chip 25b has main surfaces 36b and 37b in a relationship of the front and back with each other. To match the illustration of FIG. 6, the main surface 36b is also referred to as an upper surface 36b and the main surface 37b is also referred to as a lower surface 37b. Herein, the case where the main surfaces 36b and 37b are flat surfaces and parallel to each other is illustrated, and in this case, the plate-shaped insulating member 35b has uniform thickness across the entire member.

A metal layer 40b is bonded to the upper surface 36b of the plate-shaped insulating member 35b, and the metal layer 40b is bonded to the lower surface 22 of the high-heat-resistant chip 25b by the bonding member 72b. Moreover, a metal layer 50b is bonded to the lower surface 37a of the plate-shaped insulating member 35b, and the metal layer 50b is bonded to the upper surface 61 of the heat sink 60 by the bonding member 74b.

In addition, there is a case where a laminate of the plate-shaped insulating member 30a and the metal layers 40a and 50a and a laminate of the plate-shaped insulating member 35b and the metal layers 40b and 50b are each referred to as an insulating substrate.

In the configuration of the semiconductor module 1E, the plate-shaped insulating member 30a extends between the low-heat-resistant chip 10a and the heat sink 60, the plate-shaped insulating member 35b extends between the high-heat-resistant chip 25b and the heat sink 60, and the plate-shaped insulating member 30c extends between the low-power portion 90c and the heat sink 60.

Furthermore, the thickness tc of the portion 33c, which faces the low-power portion 90c, of the plate-shaped insulating member 30c is greater than a thickness ta of a portion 33a, which faces the low-heat-resistant chip 10a, of the plate-shaped insulating member 30a (tc>ta). Moreover, a thickness tb of a portion 38b, which faces the high-heat-resistant chip 25b, of the plate-shaped insulating member 35b is greater than the thickness ta of the portion 33a, which faces the low-heat-resistant chip 10a, of the plate-shaped insulating member 30a (tb>ta). In addition, in the example of FIG. 6, tb=tc, but this example is not restrictive.

A relationship, in the semiconductor module 1E, among the low-heat-resistant chip 10a, the low-power portion 90c, the plate-shaped insulating members 30a and 30c, and the heat sink 60 is similar to that in the first embodiment, so that the semiconductor module 1E achieves the effect similar to that of the first embodiment.

Particularly, the plate-shaped insulating member 35b for the high-heat-resistant chip 25b is thicker than the plate-shaped insulating member 30a for the low-heat-resistant chip 10a, so that a capacitive coupling between the high-heat-resistant chip 25b and the heat sink 60 through the plate-shaped insulating member 35b can be reduced more than a capacitive coupling between the low-heat-resistant chip 20a and the heat sink 60 through the plate-shaped insulating member 30a. Thus, insulating properties between the high-heat-resistant chip 25b and the low-power portion 90c and furthermore insulating properties between the high-heat-resistant chip 25b and the low-heat-resistant chip 10a can be secured.

Herein, the thick plate-shaped insulating member 35b increases heat resistance, but the high-heat-resistant chip 25b can achieves high temperature operation compared to the low-heat-resistant chip 10a, and thus a normal operation of the high-heat-resistant chip 25b can be secured.

Fourth Embodiment

Figure 7:
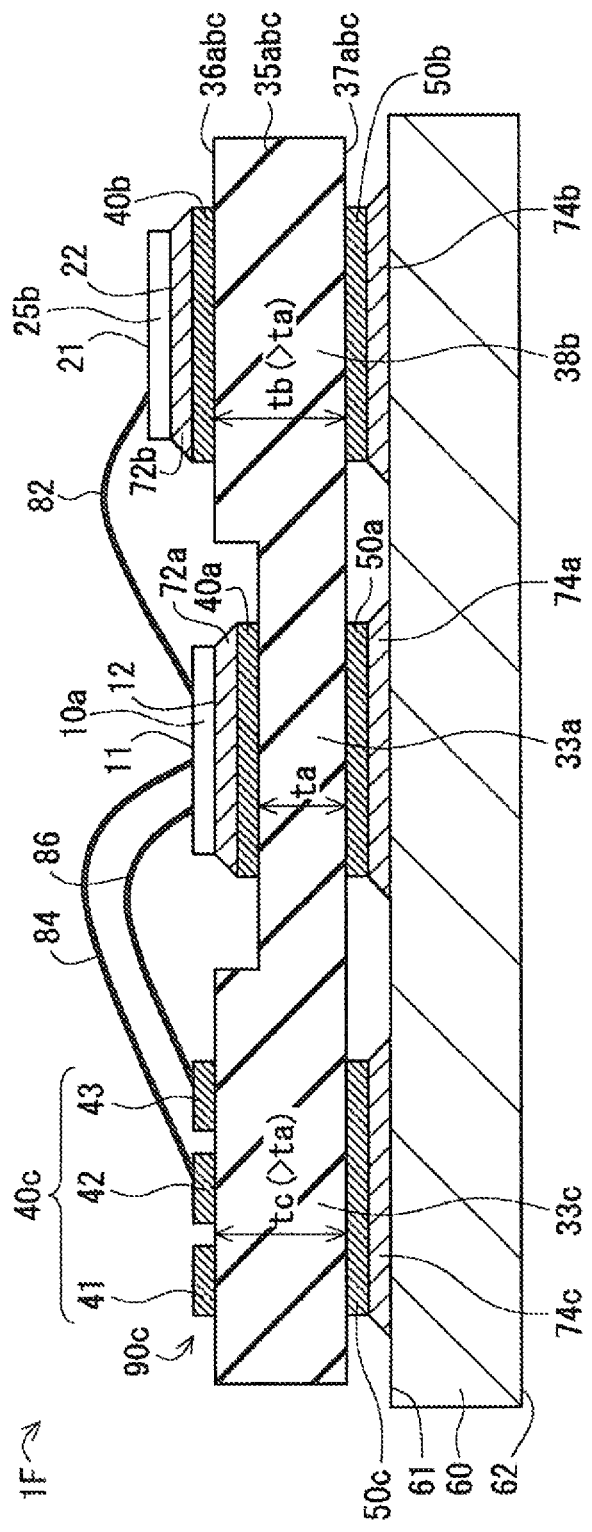
FIG. 7 is a cross sectional view illustrating a semiconductor module according to a fourth embodiment.

FIG. 7 illustrates a cross sectional view of a semiconductor module 1F according to a fourth embodiment. The semiconductor module 1F has a configuration in which the plate-shaped insulating members 30a, 35b, and 30c in the semiconductor module 1E (see FIG. 6) illustrated in the third embodiment are changed to a plate-shaped insulating member 35abc. Other configuration of the semiconductor module 1F is basically similar to that of the semiconductor module 1E.

The plate-shaped insulating member 35abc schematically corresponds to a member in which the plate-shaped insulating members 30a, 35b, and 30c (see FIG. 6) illustrated in the third embodiment are integrated. In other words, the plate-shaped insulating member 35abc extends between the low-heat-resistant chip 10a and the heat sink 60, furthermore also extends between the low-power portion 90c and the heat sink 60, and furthermore also extends between the high-heat-resistant chip 25b and the heat sink 60. The plate-shaped insulating member 35abc has main surfaces 36abc and 37abc in a relationship of the front and back with each other. To match the illustration of FIG. 7, the main surface 36abc is also referred to as an upper surface 36abc and the main surface 37abc is also referred to as a lower surface 37abc.

The thickness tc of the portion 33c, which faces the low-power portion 90c, of the plate-shaped insulating member 35abc is greater than the thickness ta of the portion 33a, which faces the low-heat-resistant chip 10a, of the plate-shaped insulating member 35abc (tc>ta). Moreover, the thickness tb of the portion 38b, which faces the high-heat-resistant chip 25b, of the plate-shaped insulating member 35abc is greater than the thickness ta of the portion 33a, which faces the low-heat-resistant chip 10a, of the plate-shaped insulating member 35abc (tb>ta). In the example of FIG. 7, tb=tc, but this example is not restrictive.

In the example of FIG. 7, in the upper surface 36abc of the plate-shaped insulating member 35abc, a region facing the low-heat-resistant chip 10a is located toward the lower surface 37abc compared to a region facing the low-power portion 90c and a region facing the high-heat-resistant chip 25b. In the example of FIG. 7, any of the regions are flat. On the other hand, the lower surface 37abc of the plate-shaped insulating member 35abc is flat in the example of FIG. 7. By such shapes of the upper surface 36abc and the lower surface 37abc, different thicknesses are formed in the common plate-shaped insulating member 35abc. The thickness difference can be formed, for example, similarly to the plate-shaped insulating member 30abc (see FIG. 3) illustrated in the second embodiment.

A relationship, in the semiconductor module 1F, among the low-heat-resistant chip 10a, the high-heat-resistant chip 25b, the low-power portion 90c, the plate-shaped insulating member 35abc, and the heat sink 60 is similar to that in the third embodiment, so that the semiconductor module 1F achieves the effect similar to that of the third embodiment.

Fifth Embodiment

Figure 8:
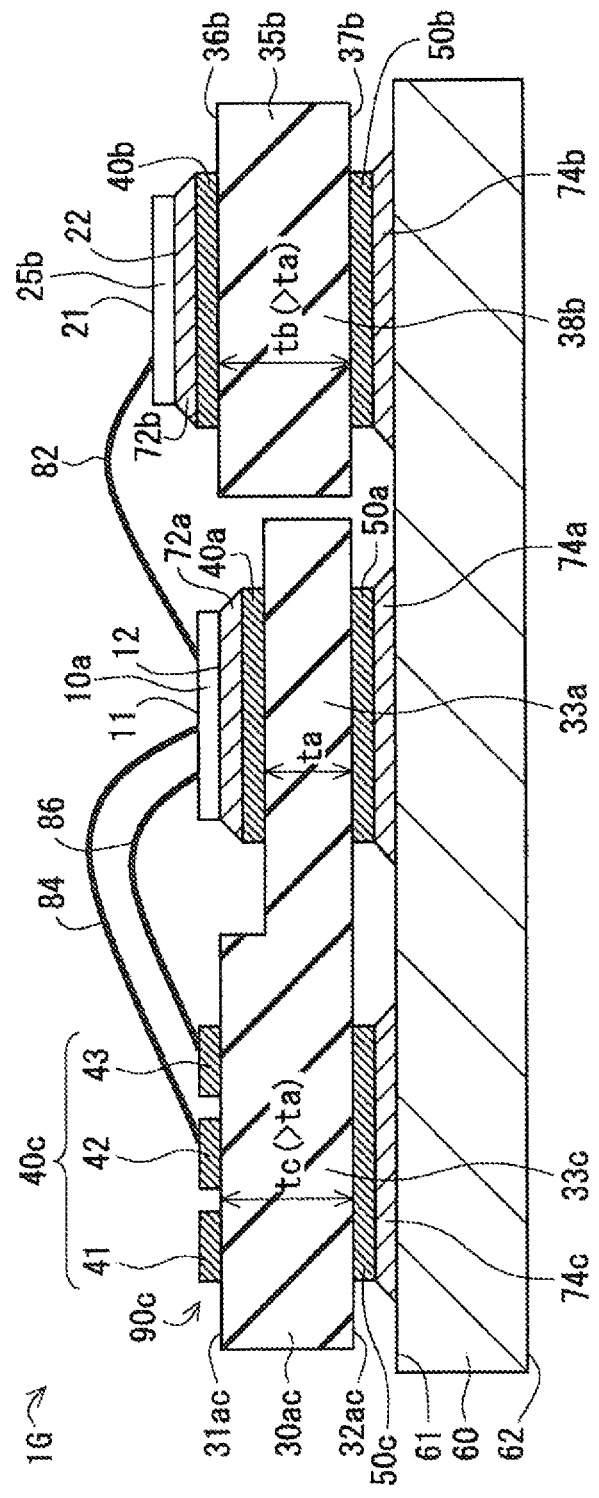
FIG. 8 is a cross sectional view illustrating a semiconductor module according to a fifth embodiment.

FIG. 8 illustrates a cross sectional view of a semiconductor module 1G according to a fifth embodiment. The semiconductor module 1G has a configuration in which the plate-shaped insulating members 30a and 30c in the semiconductor module 1E (see FIG. 6) illustrated in the third embodiment are changed to a plate-shaped insulating member 30ac. Other configuration of the semiconductor module 1G is basically similar to that of the semiconductor module 1E.

The plate-shaped insulating member 30ac schematically corresponds to a member in which the plate-shaped insulating members 30a and 30c (see FIG. 6) illustrated in the third embodiment are integrated. In other words, the plate-shaped insulating member 30ac extends between the low-heat-resistant chip 10a and the heat sink 60 and also extends between the low-power portion 90c and the heat sink 60. The plate-shaped insulating member 30ac has main surfaces 31ac and 32ac in a relationship of the front and back with each other. To match the illustration of FIG. 8, the main surface 31ac is also referred to as an upper surface 31ac and the main surface 32ac is also referred to as a lower surface 32ac.

The thickness tc of the portion 33c, which faces the low-power portion 90c, of the plate-shaped insulating member 30ac is greater than the thickness to of the portion 33a, which faces the low-heat-resistant chip 10a, of the plate-shaped insulating member 30ac (tc>ta). In the example of FIG. 8, in the upper surface 31ac of the plate-shaped insulating member 30ac, a region facing the low-heat-resistant chip 10a is located toward the lower surface 32ac compared to a region facing the low-power portion 90c. In the example of FIG. 8, any of the regions are flat. On the other hand, the lower surface 32ac of the plate-shaped insulating member 30ac is flat in the example of FIG. 8. By such shapes of the upper surface 31ac and the lower surface 32ac, different thicknesses are formed in the common plate-shaped insulating member 30ac. The thickness difference can be formed, for example, similarly to the plate-shaped insulating member 30abc (see FIG. 3) illustrated in the second embodiment.

A relationship, in the semiconductor module 1G, among the low-heat-resistant chip 10a, the high-heat-resistant chip 25b, the low-power portion 90c, the plate-shaped insulating members 30ac and 35b, and the heat sink 60 is similar to that in the third embodiment, so that the semiconductor module 1G achieves the effect similar to that of the third embodiment.

Sixth Embodiment

Figure 9:
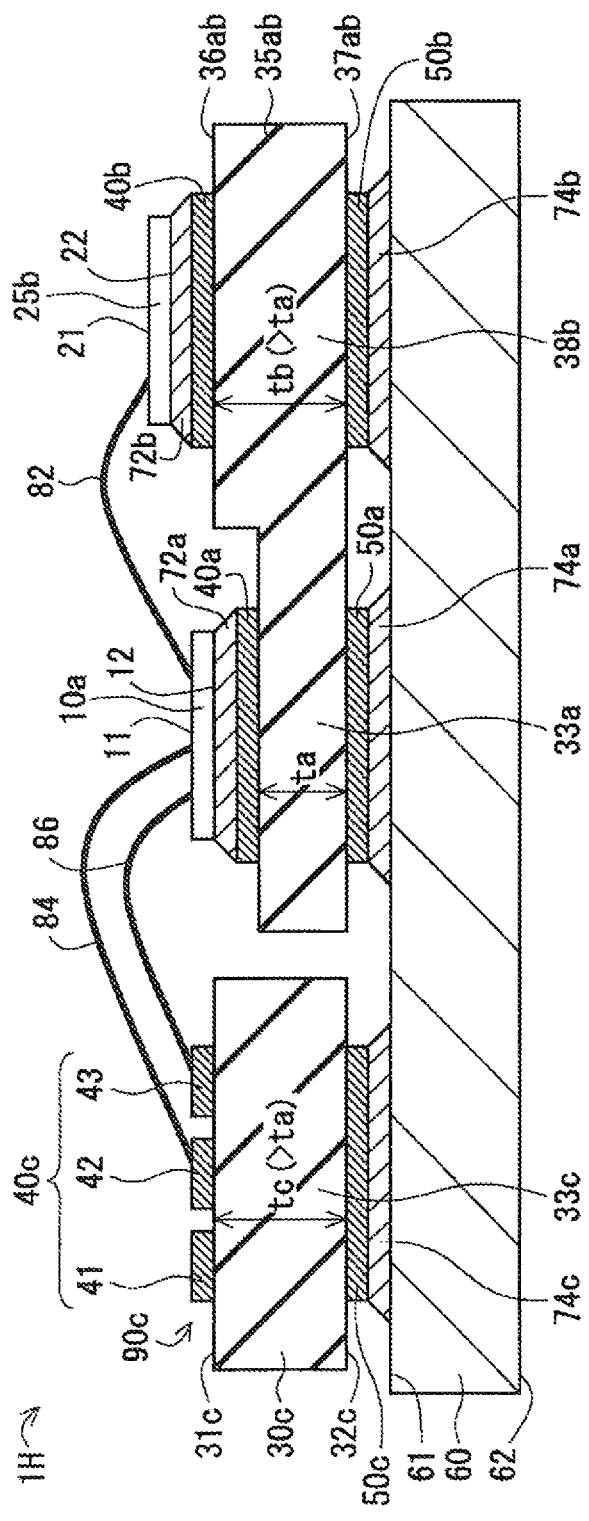
FIG. 9 is a cross sectional view illustrating a semiconductor module according to a sixth embodiment.

FIG. 9 illustrates a cross sectional view of a semiconductor module 1H according to a sixth embodiment. The semiconductor module 1H has a configuration in which the plate-shaped insulating members 30a and 35b in the semiconductor module 1E (see FIG. 6) illustrated in the third embodiment are changed to a plate-shaped insulating member 35ab. Other configuration of the semiconductor module 1H is basically similar to that of the semiconductor module 1E.

The plate-shaped insulating member 35ab schematically corresponds to a member in which the plate-shaped insulating members 30a and 35b (see FIG. 6) illustrated in the third embodiment are integrated. In other words, the plate-shaped insulating member 35ab extends between the low-heat-resistant chip 10a and the heat sink 60 and also extends between the high-heat-resistant chip 25b and the heat sink 60. The plate-shaped insulating member 35ab has main surfaces 36ab and 37ab in a relationship of the front and back with each other. To match the illustration of FIG. 9, the main surface 36ab is also referred to as an upper surface 36ab and the main surface 37ab is also referred to as a lower surface 37ab.

The thickness tb of the portion 38b, which faces the high-heat-resistant chip 25b, of the plate-shaped insulating member 35ab is greater than the thickness to of the portion 33a, which faces the low-heat-resistant chip 10a, of the plate-shaped insulating member 35ab (tb>ta). In the example of FIG. 9, in the upper surface 36ab of the plate-shaped insulating member 35ab, a region facing the low-heat-resistant chip 10a is located toward the lower surface 37ab compared to a region facing the high-heat-resistant chip 25b. In the example of FIG. 9, any of the regions are flat. On the other hand, the lower surface 37ab of the plate-shaped insulating member 35ab is flat in the example of FIG. 9. By such shapes of the upper surface 36ab and the lower surface 37ab, different thicknesses are formed in the common plate-shaped insulating member 35ab. The thickness difference can be formed, for example, similarly to the plate-shaped insulating member 30abc (see FIG. 3) illustrated in the second embodiment.

A relationship, in the semiconductor module 1H, among the low heat-resistant chip 10a, the high-heat-resistant chip 25b, the low-power portion 90c, the plate-shaped insulating members 35ab and 30c, and the heat sink 60 is similar to that in the third embodiment, so that the semiconductor module 1H achieves the effect similar to that of the third embodiment.

Seventh Embodiment

Figure 10:
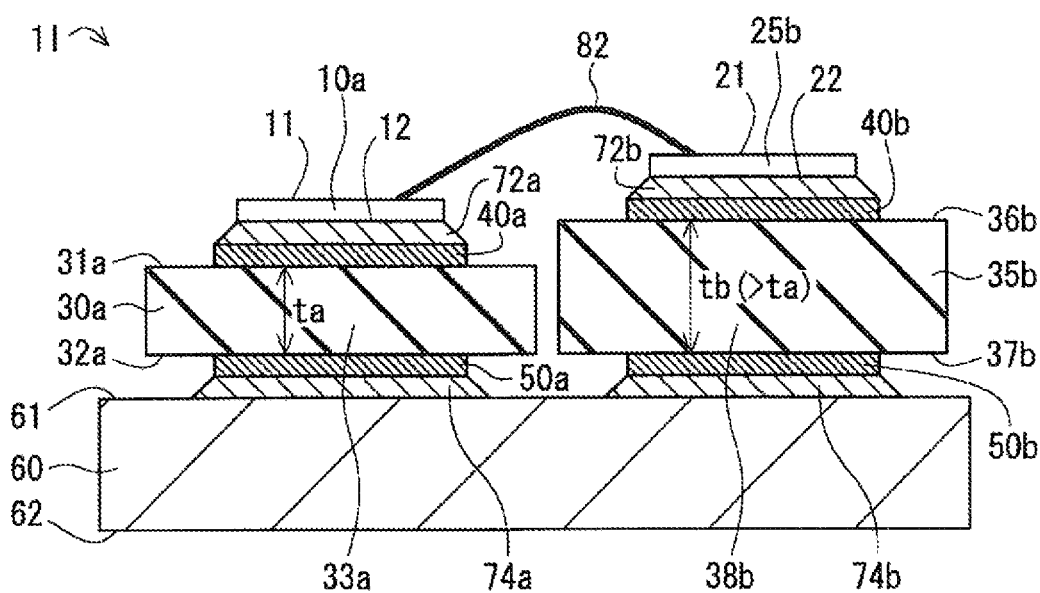
FIG. 10 is a cross sectional view illustrating a semiconductor module according to a seventh embodiment.

FIG. 10 illustrates a cross sectional view of a semiconductor module 1I according to a seventh embodiment. The semiconductor module 1I has a configuration in which the low-power portion 90c, the plate-shaped insulating member 30c, the metal layer 50c, the bonding member 74c, and the connecting members 84 and 86 are omitted from the semiconductor module 1E (see FIG. 6) illustrated in the third embodiment. Other configuration of the semiconductor module 1I is basically similar to that of the semiconductor module 1E.

The configuration of the semiconductor module 1I can also be interpreted as a configuration in which the low-power portion 90c, the metal layer 50c, the bonding member 74c, and the connecting members 84 and 86 are omitted from the semiconductor module 1G (see FIG. 8) illustrated in the fifth embodiment, and at the same time the thick portion 33c, for the low-power portion 90c, of the plate-shaped insulating member 30ac is omitted.

A relationship, in the semiconductor module 1I, among the low-heat-resistant chip 10a, the high-heat-resistant chip 25b, the plate-shaped insulating members 30a and 35b, and the heat sink 60 is similar to that in the third embodiment, so that the semiconductor module 1I achieves the effect similar to that of the third embodiment.

Eighth Embodiment

Figure 11:
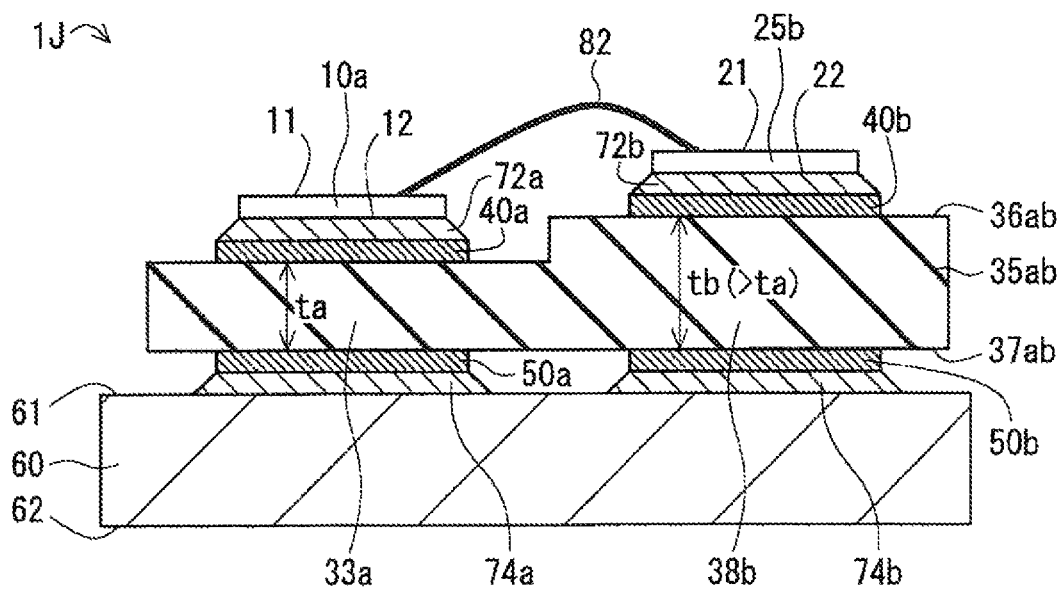
FIG. 11 is a cross sectional view illustrating a semiconductor module according to an eighth embodiment.

FIG. 11 illustrates a cross sectional view of a semiconductor module 1J according to an eighth embodiment. The semiconductor module 1J has a configuration in which the low-power portion 90c, the plate-shaped insulating member 30c, the metal layer 50c, the bonding member 74c, and the connecting members 84 and 86 are omitted from the semiconductor module 1H (see FIG. 9) illustrated in the sixth embodiment. Other configuration of the semiconductor module 1J is basically similar to that of the semiconductor module 1H.

In addition, the configuration of the semiconductor module 1J can also be interpreted as a configuration in which the low-power portion 90c, the metal layer 50c, the bonding member 74c, and the connecting members 84 and 86 are omitted from the semiconductor module 1F (see FIG. 7) illustrated in the fourth embodiment and at the same time the thick portion 33c, for the low-power portion 90c, of the plate-shaped insulating member 35abc is omitted.

A relationship, in the semiconductor module 1J, among the low-heat-resistant chip 10a, the high-heat-resistant chip 25b, the plate-shaped insulating member 35ab, and the heat sink 60 is similar to that in the third embodiment, so that the semiconductor module 1J achieves the effect similar to that of the third embodiment.

Modifications of Third to Eighth Embodiments

The protruding portion 34 (see FIGS. 3 and 5) illustrated in the modifications of the first and second embodiments is also applicable to the third to eighth embodiments.

Modifications of First to Eighth Embodiments

In the present invention, the above preferred embodiments can be arbitrarily combined, or each preferred embodiment can be appropriately varied or omitted within the scope of the invention.

DESCRIPTION OF NUMERALS 1, 1B to 1J semiconductor module; 10a, 20b power semiconductor chip; 25b high-heat-resistant chip; 30ab, 30c, 30abc, 30a, 35b, 35abc, 30ac, 35ab plate-shaped insulating member; 60 heat sink; 61 main surface (predetermined surface); 90c low-power portion; 33ab, 33a portion facing power semiconductor chip; 33c portion facing low-power portion; 38b portion facing high-heat-resistant chip; tab, tc, ta, tb thickness

The invention claimed is:
1. A semiconductor module, comprising:
a heat sink having conductivity;
a power semiconductor chip located on a predetermined surface side of said heat sink;
a low-power portion that is located on said predetermined surface side of said heat sink and has power consumption lower than that of said power semiconductor chip;
a first plate-shaped insulating member extending between said power semiconductor chip and said heat sink; and a second plate-shaped insulating member extending between said low-power portion and said heat sink, wherein a portion, which faces said low-power portion, of said second plate-shaped insulating member is thicker than a portion, which faces said power semiconductor chip, of said first plate-shaped insulating member, said semiconductor module further comprising:

a high-heat-resistant chip that is located on said predetermined surface side of said heat sink and has heat resistance higher than that of said power semiconductor chip; and a third plate-shaped insulating member extending between said high-heat-resistant chip and said heat sink, wherein a portion, which faces said high-heat-resistant chip, of said third plate-shaped insulating member is thicker than said portion, which faces said power semiconductor chip, of said first plate-shaped insulating member.

2. The semiconductor module according to claim 1, further comprising:

base layers bonded on surfaces of said first, second and third plate-shaped insulating members respectively, said surfaces facing said heat sink; and bonding member bonding said base layers and said predetermined surface of said heat sink.

3. The semiconductor module according to claim 1, wherein said first plate-shaped insulating member has a protruding portion surrounding said power semiconductor chip.

4. A semiconductor module, comprising:

a heat sink having conductivity;

a power semiconductor chip located on a predetermined surface side of said heat sink;

a high-heat-resistant chip that is located on said predetermined surface side of said heat sink and has heat resistance higher than that of said power semiconductor chip;

a plate-shaped insulating member extending between said power semiconductor chip and said heat sink; and another plate-shaped insulating member extending between said high-heat-resistant chip and said heat sink, wherein a portion, which faces said high-heat-resistant chip, of said another plate-shaped insulating member is thicker than a portion, which faces said power semiconductor chip, of said plate-shaped insulating member.

5. The semiconductor module according to claim 4, further comprising:

base layers bonded on surfaces of said plate-shaped insulating members and said another plate-shaped insulating members respectively, said surfaces facing said heat sink; and bonding member bonding said base layers and said predetermined surface of said heat sink.

6. The semiconductor module according to claim 4, wherein said plate-shaped insulating member has a protruding portion surrounding said power semiconductor chip.

* * * * *